(12) United States Patent
Sasano

(10) Patent No.: US 6,250,534 B1
(45) Date of Patent: Jun. 26, 2001

(54) WIRE BONDING METHOD

(75) Inventor: Toshiaki Sasano, Sagamihara (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 09/164,332

(22) Filed: Oct. 1, 1998

Related U.S. Application Data

(62) Division of application No. 08/735,994, filed on Oct. 23, 1996, now Pat. No. 5,862,974.

(30) Foreign Application Priority Data

Oct. 23, 1995 (JP) .................................................. 7-299190

(51) Int. Cl.[7] .................................................. H01L 21/60
(52) U.S. Cl. ........................ 228/102; 228/180.5; 382/151
(58) Field of Search .................................. 228/102, 105, 228/180.22, 180.5; 382/145, 151

(56) References Cited

U.S. PATENT DOCUMENTS

| | | | |
|---|---|---|---|
| 4,010,885 | * | 3/1977 | Keizer et al. .......................... 228/6.2 |
| 4,437,603 | * | 3/1984 | Kobayashi et al. .................... 228/4.5 |
| 4,441,205 | * | 4/1984 | Berkin et al. ......................... 382/151 |
| 4,671,446 | * | 6/1987 | Sherman ............................... 228/4.5 |
| 4,674,670 | * | 6/1987 | Watanabe et al. ..................... 228/102 |
| 4,675,993 | * | 6/1987 | Harada .................................. 29/740 |
| 4,759,073 | * | 7/1988 | Shah et al. ............................. 382/151 |
| 4,913,335 | * | 4/1990 | Yoshida ................................. 228/103 |
| 4,972,311 | * | 11/1990 | Holdgrafer ........................ 364/167.01 |
| 5,062,565 | * | 11/1991 | Wood et al. ............................. 228/9 |
| 5,119,436 | * | 6/1992 | Holdgrafer ........................... 382/146 |
| 5,205,463 | * | 4/1993 | Holdgrafer et al. ................. 228/102 |
| 5,356,065 | * | 10/1994 | Kobayashi ............................. 228/4.5 |
| 5,407,275 | * | 4/1995 | Long ....................................... 374/5 |
| 5,600,733 | * | 2/1997 | MacDonald et al. ................ 382/144 |

FOREIGN PATENT DOCUMENTS

| | | | |
|---|---|---|---|
| 404240740 | * | 8/1992 | (JP) .................................... 228/102 |
| 410116852 | * | 5/1998 | (JP) .................................... 228/102 |

* cited by examiner

*Primary Examiner*—Samuel M. Heinrich
(74) *Attorney, Agent, or Firm*—Koda & Androlia

(57) ABSTRACT

A method and apparatus for wire bonding that allows easy checking and correction of bonding point coordinates in which upon the registration of the coordinates of fixed points used for alignment in a fixed point standard pattern storage memory and the subsequent registration of the coordinates of bonding points in a bonding point coordinate memory, the coordinates of bonding points and the images of pads or leads obtained by a camera at the time of the registration of the coordinates are both registered in an image data storage memory, so that the registered images are displayed on a monitor in cases where bonding point coordinates are checked or corrected at a later time.

1 Claim, 4 Drawing Sheets

WIRE BONDING METHOD

This is a Divisional Application of application Ser. No. 08/735,994, filed Oct. 23, 1996, now U.S. Pat. No. 5,862,974.

BACKGROUND OF THE INVENTION

1. Field of the Invention

The present invention relates to a wire bonding method and apparatus and more particularly to a wire bonding method and apparatus which are used when bonding point coordinates are registered and corrected.

2. Prior Art

FIG. 4 shows one of typical semiconductor devices. In this semiconductor device, pellets 1 are mounted on lead frames 2, and pads 1$a$1 on the pellets 1 are connected to leads 2$a$1 on the lead frames 2 by means of wires 3$a$1. FIG. 5 shows the designations of respective pads, leads and wires to which symbols indicating the bonding order have been assigned. In the following description, pads 1$a$1, 1$a$2 . . . 1$a$14 will be referred to in general as 1$a$n, leads 2$a$1, 2$a$2 . . . 2$a$14 will be referred to in general as 2$a$n, and wires 3$a$1, 3$a$2 . . . 3$a$14 referred to in general as 3$a$n. In other words, pads 1$a$n and leads 2$a$n are connected by means of wires 3$a$n.

The wire bonding apparatus which connects the wires 3$a$n is constructed as shown in FIG. 6.

A bonding head 8 is mounted on an XY table 7 which is driven in the X and Y directions by an X-axis motor 5 and a Y-axis motor 6. A bonding arm 9 is installed on this bonding head 8 so as to move upward and downward or pivot. The bonding arm 9 is moved upward and downward or caused to pivot by a Z-axis motor (not shown). A bonding tool 10 is fastened to the tip end of the bonding arm 9, and a wire (not shown) is passed through this bonding tool 10. Furthermore, a camera holding part 11 is fastened to the bonding head 8, and a camera 12 is attached to the tip end of the camera holding part 11 so as to be offset from the bonding tool 10. The workpieces 13 to which wires are connected are fed to the bonding position by a frame feeder 14.

In order to perform bonding using the wire bonding apparatus as described above, it is necessary to register the bonding coordinates beforehand. In the registration of the bonding coordinates, a standard pattern which is used for workpiece alignment is first stored in memory, and positions which are used to store this pattern in memory are registered as fixed points. Afterward, the registration of bonding coordinates is performed. Generally, in semiconductor devices of the type shown in FIG. 4, the relative positional relationship of the respective pads lan on the pellet 1 is fixed. Furthermore, the relative positional relationship of the respective leads 2$a$n on the lead frame 2 is also fixed. However, since the pellet 1 is fastened to the lead frame 2 by adhesion, the positional relationship between the coordinates on the side of the pellet 1 and the coordinates on the side of the lead frame 2 is usually different in each workpiece 13.

Generally, the bonding positions of the respective pads 1$a$n can be calculated by detecting the shift from the regular positions of at least two fixed points on the pellet 1, and the bonding positions of the respective leads 2 is calculated by detecting the shift from the regular positions of at least two fixed points on the lead frame 2. As a result, bonding is performed in the correct positions of the pads 1$a$n and lead frames 2$a$n. In more complicated semiconductor devices, there may be a detection of positional shifts that use a larger number of fixed points.

An example is described below in which two fixed points on the pellet side and two fixed points on the lead frame side are used. A method that is generally used to perform such an alignment detection of fixed points includes storing a standard pattern of fixed points in memory so that regularizing correlation processing is performed. Naturally, however, other types of detection processing may also be used.

In particular, the registration of fixed points on the side of the pellet 1 is accomplished in the following manner:

Cruciform reticle marks which indicate the center of the camera 12 are displayed on the television monitor (called "monitor") which shows the images obtained by the camera 12; a chessman or digital switch which drives the XY table 7 is operated so that the XY table is moved and the camera 12 is positioned above the pellet 1, and the chessman or digital switch is then operated (while the monitor is viewed by the operator) so that the center of the reticle marks on the monitor is aligned with the desired point. Then, a registration switch is pressed, thus causing the coordinates of the XY table 7 to be registered in the bonding point coordinate memory as a first fixed point. At the same time, the standard pattern of this fixed point is registered in the fixed point standard pattern storage memory. By using a similar operation, a separate point on the pellet 1 is registered as a second fixed point. Incidentally, two separated positions at opposite corners are selected as these fixed points. Fixed points on the side of the lead frame 2 are also registered by means of a similar operation.

After the fixed points are registered, the bonding point coordinates are then registered. As in the case described above, this registration of bonding point coordinates is accomplished in the following manner:

The chessman or digital switch is operated so that the XY table 7 is moved, thus causing the camera 12 to be positioned above the pad 1$a$n or lead 2$a$n that is to be bonded. Then, while viewing the monitor, the operator operates the chessman or digital switch so that the center of the reticle marks on the monitor is aligned with the desired position of the pad 1$a$n or lead 2$a$n. Next, the registration switch is pressed so that the coordinates of the XY table 7 are registered in the bonding point coordinate memory as bonding coordinates. This operation is performed for all of the bonding points, so that the respective bonding point coordinates are registered in the bonding point coordinate memory. Generally, the desired bonding positions are set at the centers of the pads 1$a$n and leads 2$a$n.

By thus registering the coordinates of two fixed points on the side of the pellet 1, two fixed points on the side of the lead frame 2 and the respective bonding points, it is possible to detect any shift of the fixed points in subsequent workpieces 13 of the same type that are to be bonded. Accordingly, the bonding point coordinates can be automatically corrected so that wire bonding can be performed automatically. In other words, the camera 12 is moved to points above the regular fixed points that have been registered beforehand so that any positional shift of the actual fixed points from the regular fixed points is detected. Then, the actual bonding point coordinates of the respective bonding points are automatically calculated on the basis of these positional shift detection values, and the bonding tool 10 is guided to these corrected bonding points (i.e., the XY table 7 is moved to the respective bonding point coordinates), so that the bonding work is performed automatically.

Actual bonding work is accomplished by moving the XY table 7 to coordinates obtained by adding the amount of offset between the center of the camera 12 and the center of the bonding tool 10 to the respective bonding point coordinates that have been corrected for the positional shift, so that the bonding tool 10 is brought to the respective bonding points. The wire bonding methods and apparatuses of this type are disclosed in, for instance, Japanese Patent Application Publication (Kokoku) Nos. 57-11498, 57-33852, 57-50059 and 61-6541.

Conventionally, in order to determine the positions of the bonding points after the coordinates of the fixed points and bonding points have been registered, the following method has been employed:

The XY table 7 is moved to the position of the stored bonding point coordinates, after which the pad 1an or lead 2an and the reticle marks shown on the monitor are examined, and a determination is made to see if there is any positional shift in the bonding point.

However, in cases where it is desired to check or correct bonding point coordinates after bonding has been completed or after the workpiece 13 used for coordinate registration has been sent into a subsequent process, it is necessary to use a method in which the positions of the coordinates are checked using a different workpiece 13 of the same type.

More specifically, in such a conventional method, the shift of the fixed points (i. e., at least two fixed points) from the positions of the regular bonding point coordinates is again detected, and the positions of the actual bonding point coordinates of the respective bonding points are calculated on the basis of these detection values. Then, the XY table 7 is moved to these corrected bonding point coordinate positions, and the pad 1an or lead 2an and reticle marks shown on the monitor in each case are examined to see if there has been any positional shift in the bonding point. Accordingly, the alignment of the two fixed points must be performed accurately, and if there is any shift in this alignment, the respective bonding points will appear to be shifted, so that accurate checking or correction is impossible.

SUMMARY OF THE INVENTION

Accordingly, the object of the present invention is to provide a wire bonding method and apparatus in which it is not necessary to reset another workpiece when it is desired to check or correct bonding point coordinates, so that any shift that might arise from the accompanying alignment operation required in the case of such resetting can be eliminated, thus allowing easy checking and correction of bonding point positions.

The object described above is accomplished by a unique method for a wire bonding method in which pads on pellets and leads on lead frames are connected by wires, and the unique method of the present invention is that when the coordinates of fixed points used for alignment and subsequently the coordinates of bonding points are registered, the coordinates of bonding points and the images of pads or leads, which are obtained by a camera at the time that the coordinates of bonding points are registered, are both registered, so that the registered images of pads or leads are displayed on a television monitor when bonding point coordinates are subsequently checked or corrected.

The object is accomplished by a unique structure of the present invention for a wire bonding apparatus that includes:

a. a bonding tool which connects pads on pellets and leads on lead frames via wires, b. a camera which takes images of the bonding surface, c. an XY table which drives both the bonding tool and the camera in the X and Y directions, d. a manual operating means which allows manual movement of the XY table, e. an image memory which stores the images obtained by the camera and a television monitor which displays the images, f. an image operational control section which processes the images stored in the image memory and calculates the amount of shift in fixed points used for alignment, g. a fixed point standard pattern storage memory which stores a standard pattern of fixed points, h. a bonding point coordinate memory which stores the coordinates of bonding points and fixed points, and i. an apparatus operational control section which calculates the bonding point coordinates stored in the bonding point coordinate memory in accordance with the positional shifts calculated by the image operational control section, and the unique structure of the present invention is that the bonding apparatus further includes an image data storage memory which stores image data supplied from the image memory, so that when the bonding point coordinates are registered in the bonding point coordinate memory, the image data (of the pads or leads) stored in the image memory at the time of such a coordinate registration is also stored in the image data storage memory.

DETAILED DESCRIPTION OF THE PREFERRED EMBODIMENTS

One embodiment of the present invention will be described with reference to FIGS. 1 through 6.

Figure 1:
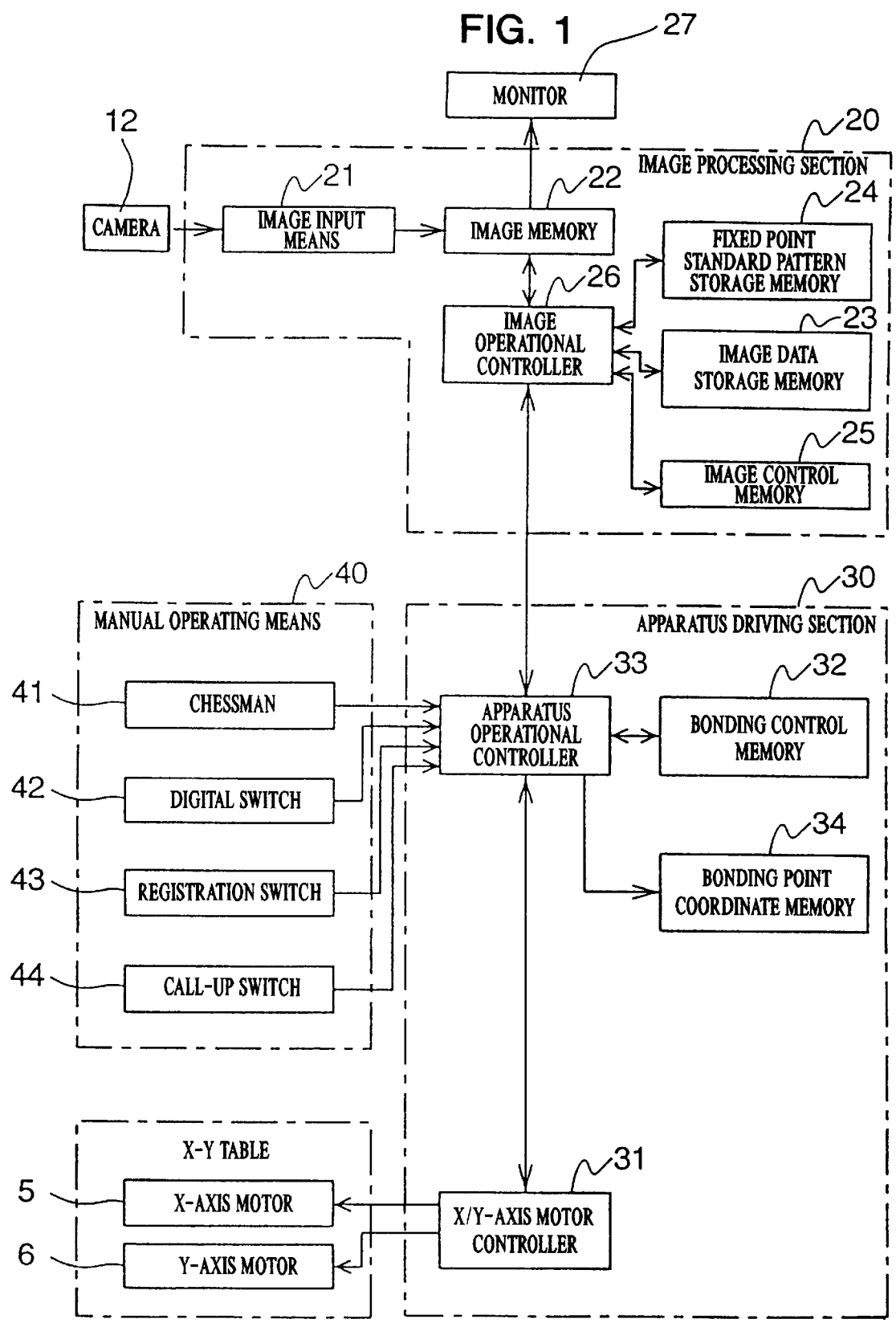
FIG. 1 is a block diagram which illustrates one embodiment of the control circuit part used in the wire bonding method and apparatus of the present invention.
Figure 6:
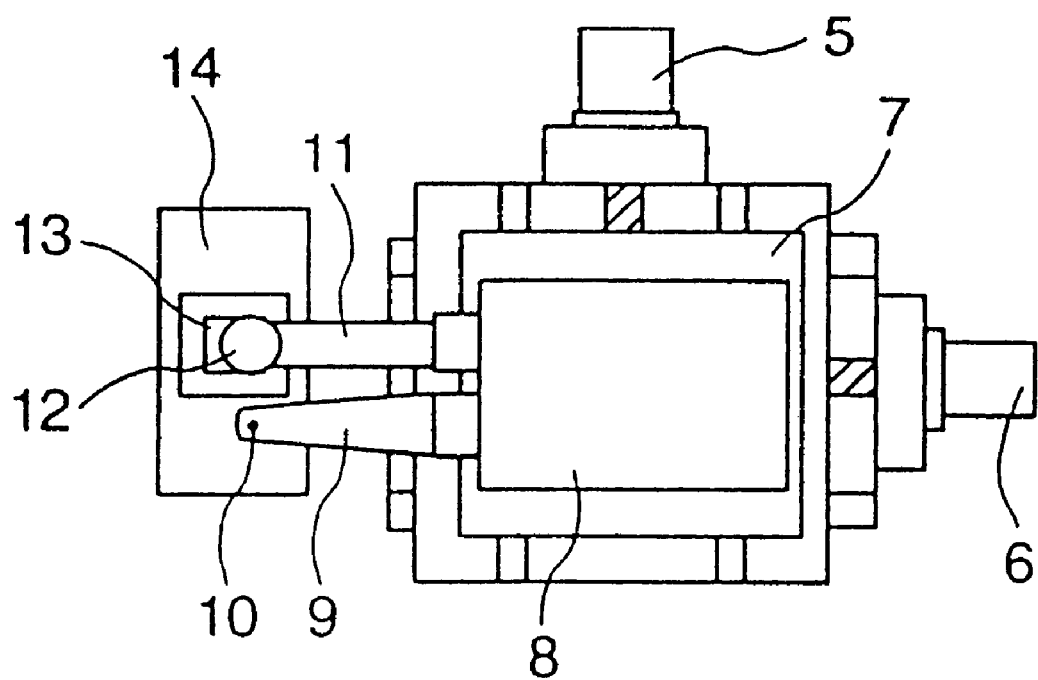
FIG. 6 is a plan view which schematically illustrates the overall construction of a wire bonding apparatus.

As shown in FIG. 1, the wire bonding apparatus of FIG. 6 mainly includes an image processing section 20 which processes images obtained by a camera 12, an apparatus driving section 30 which operates the wire bonding apparatus, and a manual operating means 40 which is used for manually operating the XY table 7.

The image processing section 20 includes: an image memory 22 which stores image shapes inputted by the camera 12 via an image input means 21, an image data storage memory 23 which stores image data from the image memory 22, a fixed point standard pattern storage memory 24 which stores fixed point standard patterns, an image control memory 25 in which image processing steps for the image memory 22 are stored, and an image operational controller 26 which processes images from the image memory 22 in accordance with the procedures stored in the image control memory 25. Furthermore, images from the image memory 22 are displayed on a television monitor (called "monitor") 27.

The apparatus driving section 30 includes: an X/Y-axis motor controller 31, a bonding control memory 32 an apparatus operational controller 33, and a bonding point coordinate memory 34. The X/Y-axis motor controller 31 controls an X-axis motor 5 and a Y-axis motor 6. The bonding control memory 32 stores control steps for controlling the X-axis motor 5 and Y-axis motor 6 (for the purpose of bonding operations) and steps for calculating the bonding point coordinates. The apparatus operational controller 33 controls the X/Y-axis motor controller 31 and the bonding control memory 32, and it also calculates the actual bonding point coordinates on the basis of positional shift amounts calculated by the image operational control section 26 and bonding point coordinate data inputted by the manual operating means 40. The bonding point coordinate memory 34 stores the coordinates of fixed points and bonding points inputted by the manual operating means 40 or calculated by the apparatus operational controller 33.

The manual operating means 40 includes a chessman 41, a digital switch 42, a registration switch 43 and a call-up switch 44. The XY table 7 is operated using either the chessman 41 or the digital switch 42.

Next, the registration method will be described. The registration of the fixed point coordinates and respective bonding point coordinates is the same as that of the conventional method.

In the preferred embodiment, as described above, the image data storage memory 23 is provided in the bonding apparatus, and images of pads or leads at respective bonding point coordinates are arranged in the same order as the corresponding bonding point coordinates stored in the bonding point coordinate memory 34, and then such images are stored in the image data storage memory 23. Furthermore, the bonding coordinate data is expressed as data obtained by adding corrections (described later) to the XY table coordinate values actually measured at the time the bonding coordinate registration is made.

More specifically, the coordinate data B (Bx, By) for the respective bonding coordinates can be expressed by Equation 1 shown below, and in this Equation 1, Tx is the X coordinate value of the XY table at the time of bonding coordinate registration, Ty is the Y coordinate value of the XY table at the time of bonding coordinate registration, Dx is the X coordinate correction amount in cases where a correction is applied to the coordinate position, and Dy is the Y coordinate correction amount in cases where a correction is applied to the coordinate position.

Tx, Ty, Dx and Dy are respectively stored in the bonding [point] coordinate memory 34.

$$Bx = Tx + Dx$$
$$By = Ty + Dy$$

Equation 1

The above registration method will be described in greater detail. First, registration of the fixed points is performed. This registration is accomplished as follows:

First, the chessman 41 or digital switch 42 of the manual operating means 40 is operated so that the XY table 7 is moved, thus causing the camera 12 to be positioned above the first fixed point.

The first fixed point is imaged by the camera 12.

This image is converted into a digital signal by the image input means 21, and is stored in the image memory 22.

The image shapes stored in this image memory 22 are processed by the image operational controller 26 and displayed on the monitor 27.

Next, while viewing the monitor 27, the operator moves the XY table (by operating the chessman 41 or digital switch 42) so that the center of the reticle marks on the monitor 27 is aligned with the first fixed point.

Then, the registration switch 43 is pressed. As a result, the image stored in the image memory 22 at this point in time is stored (registered) in the fixed point standard pattern storage memory 24 by the image operational control section 26; and the coordinates of the XY table 7 are stored (registered) in the bonding point coordinate memory 34 by the apparatus operational control section 33 as the first fixed point. In this case, the image and coordinates of the first fixed point are registered at predetermined addresses in the fixed point standard pattern storage memory 24 and bonding point coordinate memory 34.

The second fixed point is also registered by means of a similar operation.

Next, the registration of bonding point coordinates is performed. As in the case, this registration of bonding point coordinates is accomplished as follows:

The XY table 7 is moved by operating the chessman 41 or digital switch 42, so that the camera 12 is positioned above the pad 1*an* or lead 2*an* that is to be bonded. As a result, the pad 1*an* or lead 2*an* is displayed on the monitor 27.

Then, while viewing the monitor 27, the operator moves the XY table (by operating the chessman 41 or digital switch 42) so that the center of the reticle marks on the monitor 27 is aligned with the desired position of the pad 1*an* or lead 2*an*.

Next, the registration switch 43 is pressed.

When the coordinate data for the respective bonding points is registered, the XY table coordinate values Tx and Ty actually measured at the time of bonding coordinate registration are stored in memory, and the storage in memory of the correction amounts Dx and Dy is cleared.

As a result, the image of the desired pad or lead stored in the image memory 22 at this point is stored (registered) in the image data storage memory 23 by the image operational controller 26; and the coordinates of the XY table 7 are stored (registered) in the bonding point coordinate memory 34 by the apparatus operational controller 33 as bonding point coordinates. In this case, the bonding point image and coordinates are stored at addresses which are arranged in the same order in the image data storage memory 23 and bonding point coordinate memory 34. This operation is performed for all of the bonding points, so that images and coordinates for the respective bonding points are registered in the image data storage memory 23 and bonding point coordinate memory 34.

Next, a case in which specified stored bonding point coordinates are checked or corrected will be described.

In a case where a bonding point image and coordinates stored in the image data storage memory 23 and bonding point coordinate memory 34 are to be called up, numbers arranged in the same order as the order of registration are inputted into the apparatus operational controller 33 by pressing the call-up switch 44, whereupon the apparatus operational controller 33 reads out the bonding point coordinates stored in the bonding point coordinate memory 34, also reads out the corresponding image stored in the image data storage memory 23 via the image operational control section 26, and then displays this image on the monitor 27 through the image memory 22.

Figure 2:
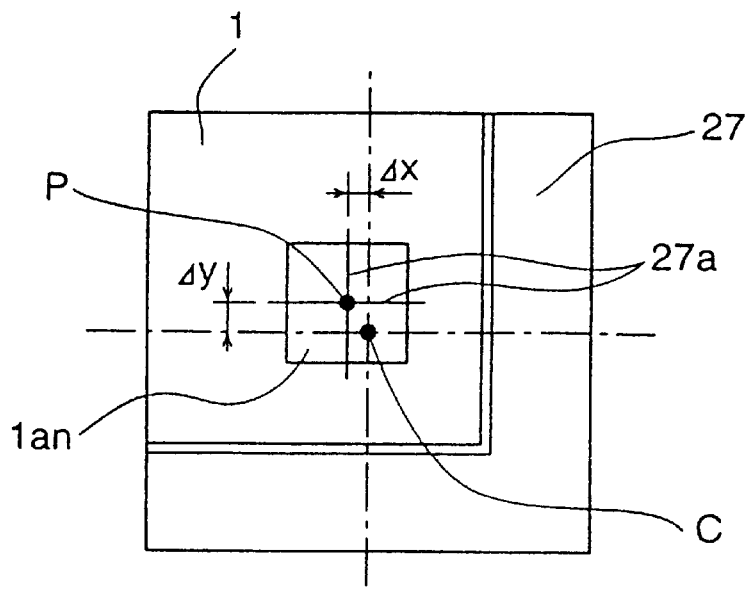
FIG. 2 is a screen diagram which shows a specified pad with bonding point coordinates stored in the bonding point coordinate memory being displayed on the television monitor.

FIG. 2 illustrates a read-out image data for a pad 1an that is displayed on the monitor 27. The position of the bonding point coordinates of the displayed image stored in the bonding point coordinate memory 34 is the center position C of the image. In cases where this is to be altered to a desired bonding point P, the chessman 41 or digital switch 42 is operated so that the crossing point of the reticle marks 27a is moved to the bonding point P. Then, when the registration switch 43 is pressed, the amounts of movement $\Delta x$ and $\Delta y$ involved in the movement from point C to point P are converted into amounts of movement of the XY table as shown by Equation 2, and Dx and Dy are stored as correction amounts for the bonding point coordinates stored in the bonding point coordinate memory 34. In Equation 2, k is a coefficient of conversion from image pixel values to XY table pulses.

$$Dx = k \cdot \Delta x$$
$$Dy = k \cdot \Delta y$$
Equation 2

In this case, if the image of the bonding point coordinates being corrected is subjected to enlargement processing when the image is displayed on the monitor 27, the image will be easier to see, so that checking of the coordinates is facilitated.

Figure 3:
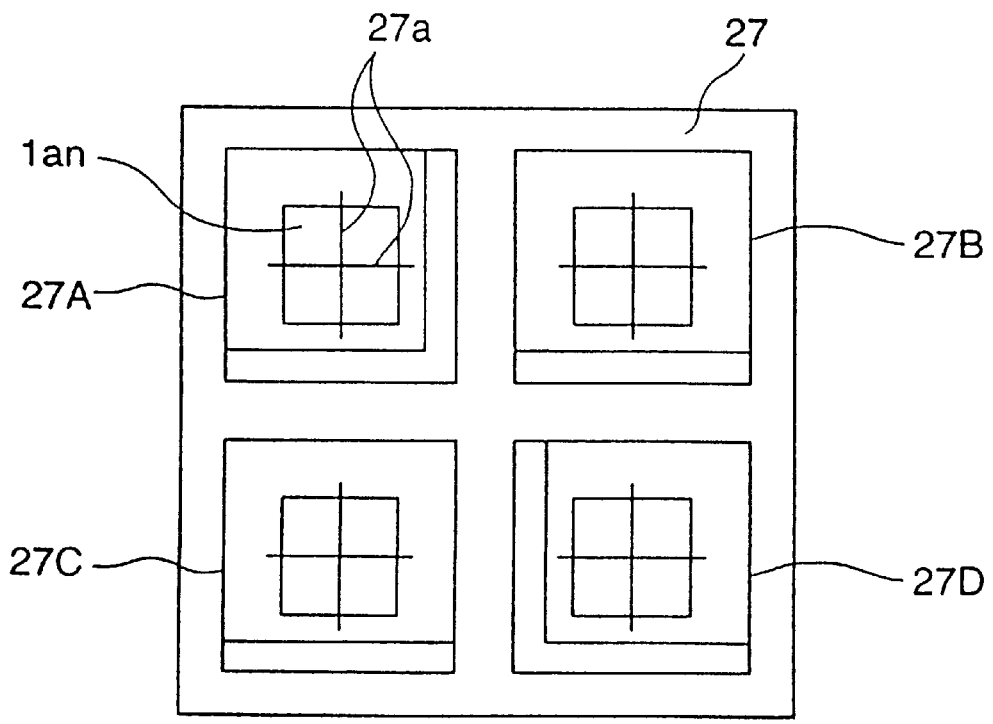
FIG. 3 is a screen diagram which shows a plurality of pads being displayed on the television monitor.
Figure 4:
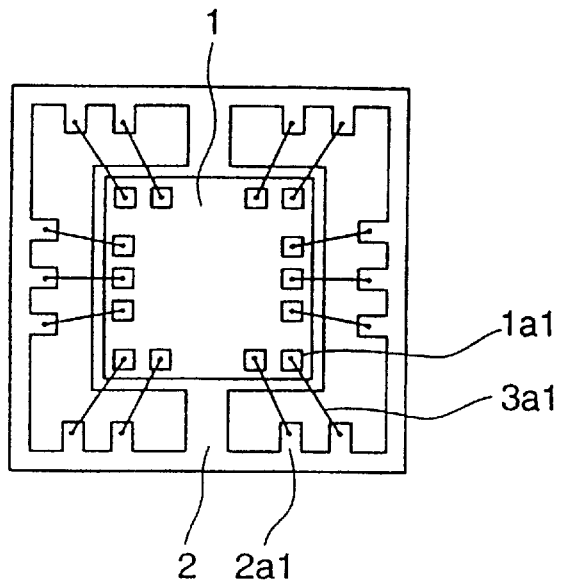
FIG. 4 is a plan view which illustrates one example of a semiconductor part.
Figure 5:
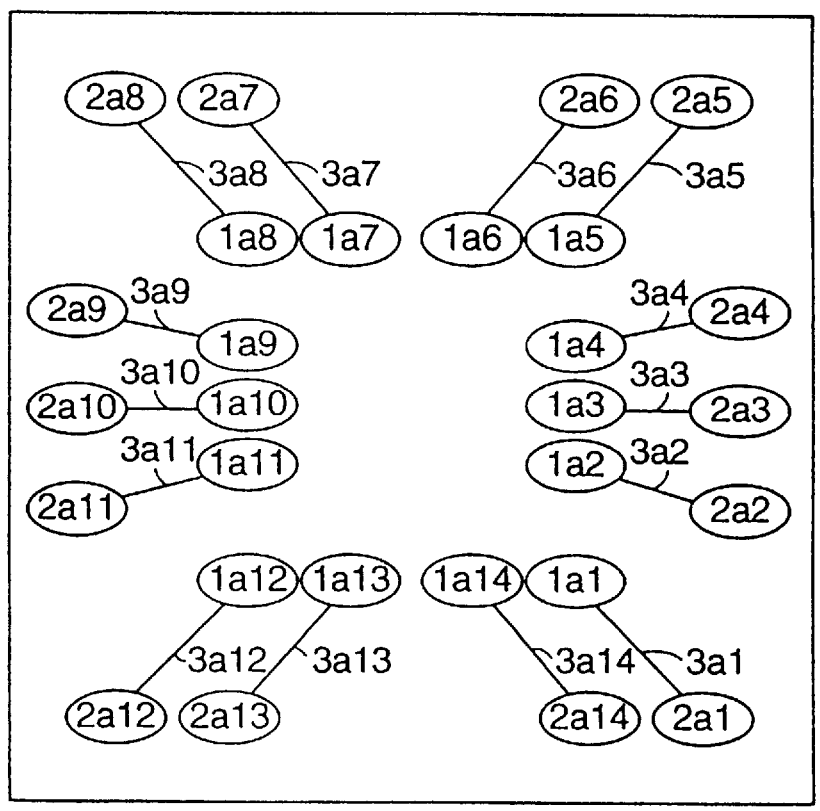
FIG. 5 is an explanatory diagram which shows the designations of respective pads, leads and wires to which symbols indicating the bonding order have been assigned.

It is also possible to form a plurality of display windows, e.g., four display windows 27A, 27B, 27C and 27D as shown in FIG. 3, thus displaying bonding point coordinates for a plurality of pads stored in the bonding point coordinate memory 34 on one screen. In such a case, since bonding point coordinates for a plurality of locations can be checked on a single screen, the working efficiency is greatly improved.

The checking and correction of bonding point coordinates on the lead side can also be performed in a similar manner.

As seen from the above, since image shapes present in the image memory 22 at the time that bonding point coordinates are registered in the bonding point coordinate memory 34 are registered in the image data storage memory, images of bonding points that are to be checked or corrected can be displayed on the monitor 27 at a later time when checking or correction of bonding point coordinates is subsequently performed. Accordingly, there is no need to reset another workpiece, and corrections can always be performed using the same coordinate system as that used when the fixed point standard patterns were stored in memory. As a result, shifts arising from adjustment of the alignment can be eliminated, so that the checking and correction of desired bonding points can be performed easily and accurately.

As described in detail above, according to the present invention, when the registration of the coordinates of fixed points and the subsequent registration of the coordinates of bonding points are performed, the coordinates of bonding points and images of pads or leads obtained by a camera at the time of the registration of coordinates of bonding points are also registered, so that the registered images are displayed on a television monitor in cases where bonding point coordinates are checked or corrected at a later time. Accordingly, in cases where it is desired to check or correct bonding point coordinates, there is no need to reset another workpiece, and the shift arising from adjustment of the alignment can be eliminated, so that the checking and correction of bonding point positions can easily be accomplished.

What is claimed is:

1. A wire bonding method comprising:

(a) imaging a bonding point with an imaging means;

(b) displaying the image from the imaging means on a display means;

(c) moving vertical marks on said display means to be centered on said bonding point to determine coordinates of the bonding point;

(d) registering the bonding point by storing the image in an image data storage memory in a same order as coordinates of the bonding point are stored in a bonding point coordinate memory;

(e) repeating steps (a)–(d) for each bonding point; and (f) retrieving a registered image of a bonding point stored in the image data storage memory and the associated bonding point coordinates stored in the bonding point coordinate memory for more easily and accurately checking and correcting the bonding point coordinates.

* * * * *